United States Patent
Mizuno et al.

(10) Patent No.: US 9,374,936 B2
(45) Date of Patent: Jun. 21, 2016

(54) WORKPIECE MOUNTING APPARATUS

(71) Applicant: TDK Corporation, Tokyo (JP)

(72) Inventors: Toru Mizuno, Tokyo (JP); Osamu Shindo, Tokyo (JP); Hitoshi Nakayama, Tokyo (JP)

(73) Assignee: TDK CORPORATION, Tokyo (JP)

( * ) Notice: Subject to any disclaimer, the term of this patent is extended or adjusted under 35 U.S.C. 154(b) by 65 days.

(21) Appl. No.: 14/306,296

(22) Filed: Jun. 17, 2014

(65) Prior Publication Data

US 2014/0290047 A1 Oct. 2, 2014

Related U.S. Application Data

(62) Division of application No. 13/597,402, filed on Aug. 29, 2012, now Pat. No. 8,782,879.

(30) Foreign Application Priority Data

Sep. 3, 2011 (JP) .................. 2011-192182

(51) Int. Cl.
*H01L 21/60* (2006.01)
*H05K 13/08* (2006.01)
(Continued)

(52) U.S. Cl.
CPC ............ *H05K 13/08* (2013.01); *H01L 21/6838* (2013.01); *H01L 24/75* (2013.01); *H01L 21/67144* (2013.01); *H01L 24/81* (2013.01); *H01L 2224/75702* (2013.01);
(Continued)

(58) Field of Classification Search
CPC .... H05K 13/08; H01L 24/75; H01L 21/6838; H01L 2224/75753; Y10T 29/49131
See application file for complete search history.

(56) References Cited

U.S. PATENT DOCUMENTS 5,195,235 A 3/1993 Mifuji
5,212,880 A 5/1993 Nishiguchi et al.
(Continued)

FOREIGN PATENT DOCUMENTS

JP 57-21296 A 2/1982
JP 5-6910 A 1/1993
(Continued)

OTHER PUBLICATIONS

Japanese Patent Office; Office Action in corresponding Japanese Patent Application No. 2011-192182 (Nov. 26, 2014).

*Primary Examiner* — Minh Trinh
(74) *Attorney, Agent, or Firm* — Leydig, Voit & Mayer, Ltd.

(57) ABSTRACT

A workpiece mounting apparatus includes a transfer apparatus having a nozzle, a first imaging unit, and an image processor. The nozzle has opposed first and second ends, a suction hole at the first end, and a transparent end face member sealing the second end. The first imaging unit captures a first pattern for positioning a workpiece. The image processor identifies a reference position of the workpiece based on the first pattern captured. The workpiece mounting apparatus also includes a substrate support supporting a substrate with a second pattern for positioning, a second imaging unit for capturing the second pattern, and a positioning unit for controlling position of the nozzle. The image processor identifies a mounting target position on the substrate, based on the second pattern capture, and the positioning unit controls the nozzle to mount the workpiece on the substrate, when the reference position coincides with the mounting target position.

1 Claim, 6 Drawing Sheets

(51) Int. Cl.
  *H01L 21/683* (2006.01)
  *H01L 23/00* (2006.01)
  *H01L 21/67* (2006.01)

(52) U.S. Cl.
  CPC ........... *H01L 2224/75745* (2013.01); *H01L 2224/75753* (2013.01); *H01L 2224/81191* (2013.01); *Y10T 29/49131* (2015.01); *Y10T 29/49769* (2015.01); *Y10T 29/53022* (2015.01); *Y10T 29/53091* (2015.01); *Y10T 29/53174* (2015.01); *Y10T 29/53178* (2015.01); *Y10T 29/53191* (2015.01)

(56) References Cited

U.S. PATENT DOCUMENTS

| | | |
|---|---|---|
| 5,379,514 A | 1/1995 | Okuda et al. |
| 5,758,409 A | 6/1998 | Nakazato |
| 6,240,628 B1 | 6/2001 | Yoshida et al. |
| 6,328,362 B1 | 12/2001 | Isogai et al. |
| 7,540,080 B2 | 6/2009 | Fukunaga |
| 8,782,879 B2* | 7/2014 | Mizuno .......... H05K 13/08 29/721 |
| 2004/0163242 A1 | 8/2004 | Fukunaga |
| 2005/0238222 A1 | 10/2005 | Nakano et al. |
| 2010/0325884 A1 | 12/2010 | Nishino et al. |

FOREIGN PATENT DOCUMENTS

| | | | |
|---|---|---|---|
| JP | 10-145094 A | 5/1998 | |
| JP | 10-308431 A | 11/1998 | |
| JP | 2004-69612 A | 3/2004 | |
| JP | 2008-124382 A | 5/2008 | |
| JP | 2011-9654 A | 1/2011 | |
| WO | WO 03/041478 A1 | 5/2003 | |

* cited by examiner

FIG. 4A
FIG. 4B
FIG. 4C
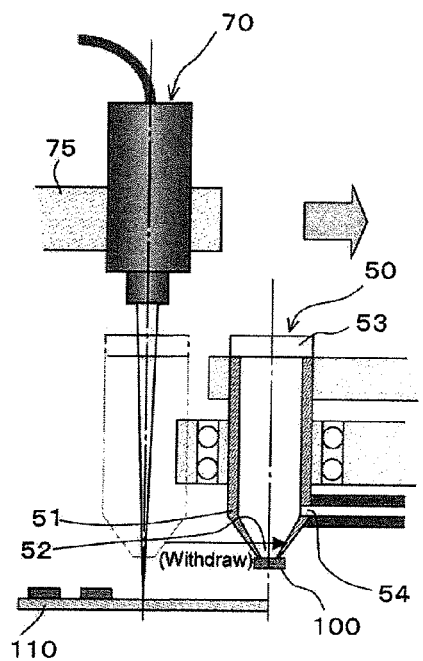
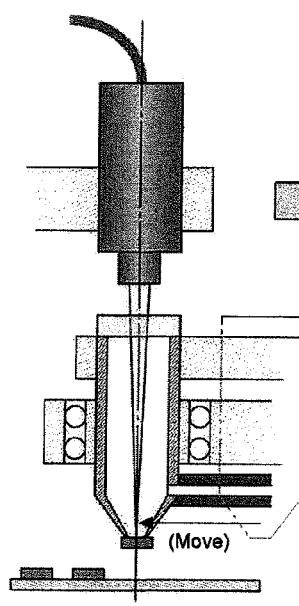
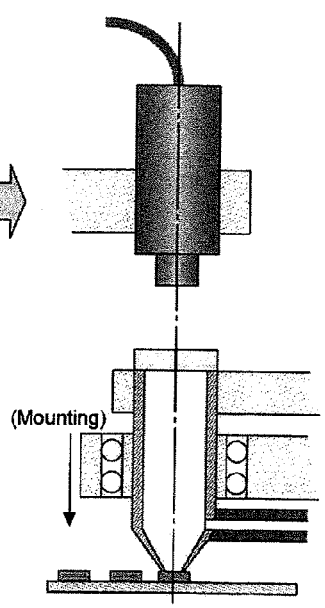
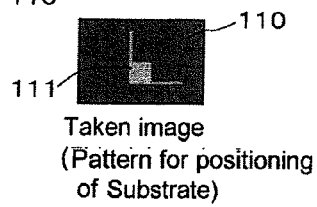
Taken image
(Pattern for positioning
of Substrate)
Taken image
(Pattern for positioning
of Workpiece)

Conventional workpiece

Recent workpiece

WORKPIECE MOUNTING APPARATUS

This patent application is a division of U.S. patent application Ser. No. 13/597,402 filed Aug. 29, 2012, now U.S. Pat. No. 8,782,879.

BACKGROUND OF THE INVENTION

1. Field of the Invention

The present invention relates to a workpiece transfer apparatus, a workpiece mounting apparatus and a workpiece mounting method. In the transfer apparatus the workpiece, for example an electronic device such as a bare chip IC is transferred, and in the mounting apparatus the workpiece is mounted on a substrate.

2. Description of the Related Art

PCT international Application Laid-Open No. W02003/041478 discloses a mounter in which a pattern for positioning of a workpiece and a pattern for positioning of a substrate are in the same direction and imaged at the same time through a transmissive outside part of an suction hole of a transparent nozzle when the mounter mounts the workpiece on the substrate using the transparent nozzle to pick up by negative pressure. Japanese Patent Application Laid-Open No. 2004-069612 is discloses a configuration in which an opening of a directional lighting device having both directional and diffusional characteristics is positioned on the same axis of an optical axis of a camera. Japanese Patent Application Laid-Open No. 10-308431 discloses a configuration which enables both to pick up a workpiece and to recognize the workpiece visually from upside by means of using a transparent nozzle.

Generally, a plurality of electronic devices especially bare chip ICs etc. is made of a wafer 200 formed and arranged a matrix of laminated patterns thereon as shown in FIG. 5, and each semiconductor component with the patterns is made by cutting the wafer 200 along cutting lines 201. Usually a predetermined width from the cutting line 201 is remained as a cutting margin on which any pattern or the like is not formed for stabilization of yield in the cutting process as shown in FIG. 6.

Generally, a positioning mark for detecting a position of the electronic device is formed with a high degree of accuracy because the positioning mark is formed in the same process (photolithography etc.) of the pattern of the electronic device. Further, instead of the positioning mark, the pattern on a surface of the electronic device is often used as a fiducial mark, too.

Many electronic devices (hereinafter "workpieces") became to be reduced size, and recently the size of some workpiece became to be less than 0.2 mm square. By necessity, a hole diameter of a workpiece pickup nozzle of a mounting apparatus is necessary to be less than one side of the workpiece.

Further, the hole diameter of the suction hole of the transparent nozzle is necessary to be more reduced diameter so as not to interfere with the pattern for positioning (as the fiducial mark) of the workpiece, if the method which disclosed in WO2003/041478 (detecting the pattern for positioning optically through the transparent nozzle) is applied. For instance, further more reducing of the diameter is demanded so that the pattern for positioning of the workpiece is not positioned inside of the suction hole of the transparent nozzle.

However it seems to be unrealistic to make the size of the suction hole smaller enabling to detect the pattern for positioning optically through the outside part of the suction hole of the transparent nozzle because forming the hole to the transparent body almost reaches to a process limitation. Specific explanation of an example of workpiece 100 is shown in FIG. 7. The workpiece 100 has bonding electrodes (bumps) 102 on a bonding face (under surface) facing to a substrate 110, and a pattern for positioning 101 for alignment (in FIG. 7, a predetermined pattern is used) is provided on an upper surface of the workpiece. Alternatively, a plurality of patterns for positioning 101 may be provided on the upper surface. Further, a pattern for positioning 111 for alignment is provided on the substrate 110, or preferably a plurality of marks 111 may be provided on the substrate 110. Hereinafter the pattern for positioning of the workpiece 100 shall be referred to as "the first pattern for positioning" that is used as a first fiducial mark, and the pattern for positioning of the substrate 110 shall be referred to as "the second pattern for positioning" that is used as a second fiducial mark. As shown in FIG. 8A, in case of a comparatively large workpiece (conventional workpiece), it is possible to detect the first pattern for positioning of the workpiece optically through the outside part of the suction hole of the transparent nozzle 215. But, as shown in FIG. 8B, in case of a smaller workpiece (recent workpiece), it is not possible to detect the first pattern for positioning of the workpiece optically through the outside part of the suction hole of the transparent nozzle. Because all or almost all of the patterns are positioned inside of the hole diameter of the suction hole even if the hole diameter of the transparent nozzle was reduced to the process limitation.

On the other hand, when a suction pathway 211 to the suction hole 210 of a transparent nozzle 215 is bent as L-shape as shown in FIG. 9A, it is not possible to detect the pattern for positioning of the workpiece 100 through the suction hole 210, because inner surface (usually cylindrical) of the bent part 212 of the suction pathway 211 interferes with a field of view of an imaging unit 250. In case of the suction pathway 211 is not bent as shown in FIG. 9B, it is also not possible to detect the pattern for positioning of the workpiece 100 through the suction hole 210, because a joint 220 for suctioning interferes with the field of view of the imaging unit 250. As mentioned above, it becomes to be difficult to detect the pattern for positioning on the upper surface of the workpiece along with downsizing of the workpiece.

SUMMARY OF THE INVENTION

The present invention has been made in view of the foregoing circumstances and problems, and an object thereof is to provide a workpiece transfer apparatus, a workpiece mounting apparatus and a workpiece mounting method those can detect a pattern for positioning of a workpiece without reducing hole diameter of a suction hole.

First embodiment of the present invention relates a workpiece transfer apparatus. The workpiece transfer apparatus comprises: a nozzle unit and an imaging unit wherein the nozzle unit comprises a tuber body, a suction hole opening at one end of the tuber body, an end face member sealing the other end of the tuber body and a suction pathway connected to a suction device, and at least part of the end face member is transparent, so that the imaging unit is able to take an image of a suctioned surface of a workpiece through the end face member and the suction hole when the workpiece is held by the suction hole.

In the workpiece transfer apparatus according to the first embodiment, the suction pathway may open at an inner side surface of the tuber body.

In the workpiece transfer apparatus according to the first embodiment, the imaging unit may be provided with a coaxial lighting.

In the workpiece transfer apparatus according to the first embodiment, the workpiece transfer apparatus further may comprise an image processor capable of identifying a reference position of the workpiece based on a first pattern for positioning included in an image taken by the imaging unit. The first pattern for positioning may be arranged on the suctioned surface of the workpiece.

Second embodiment of the present invention relates a workpiece mounting apparatus. The workpiece mounting apparatus comprises: the workpiece transfer apparatus having an image processor capable of identifying a reference position of the workpiece based on the first pattern for positioning included in the image taken by the imaging unit, a substrate support unit supporting a substrate which has a second pattern for positioning arranged at least on one side thereof, another imaging unit capable of taking an image including the second pattern for positioning of the substrate supported by the substrate support unit, and a relative positioning unit for the nozzle unit controlling the relative position of the nozzle unit. In the workpiece mounting apparatus, the image processor is able to identify a mount target position on the substrate based on the second pattern for positioning included in the image taken by the another imaging unit, and the relative positioning unit controls the nozzle unit so as to mount the workpiece on the substrate, while the reference position of the workpiece identified by the first pattern for positioning coincides with the mount target position on the substrate.

In the workpiece mounting apparatus according to the second embodiment, one imaging unit may take the images of both the first pattern for positioning and the second pattern for positioning.

Third embodiment of the present invention relates a workpiece mounting method for mounting a workpiece on a substrate wherein the workpiece is provided with a first pattern for positioning and the substrate is provided with a second pattern for positioning. The workpiece mounting method comprises: a first taking image step wherein an imaging unit takes an image of the substrate including the second pattern for positioning; identifying a mount target position of the workpiece on the substrate based on the second pattern for positioning included in the image taken by the first taking image step; a relative positioning step wherein a relative positioning unit relatively moves a nozzle unit picking up the workpiece to a position where the imaging unit capable of taking an image of the workpiece; a second taking image step wherein the imaging unit takes an image of the workpiece including the first pattern for positioning; identifying a reference position of the workpiece based on the first pattern for positioning included in the image taken by the second taking image step; a correcting step wherein the relative positioning unit corrects the relative position of the nozzle unit so that the reference position of the workpiece identified by the first pattern for positioning coincides with the mount target position; mounting the workpiece on the substrate while maintaining of coincidence between the reference position and the mount target position of the workpiece. In the workpiece mounting method, the nozzle unit comprises a tuber body, a suction hole opening at one end of the tuber body, an end face member sealing the other end of the tuber body and a suction pathway connected to a suction device, and in the second taking image step, the imaging unit is able to take an image of a suctioned surface of the workpiece through the end face member and the suction hole when the workpiece is suctioned by the suction hole.

In the workpiece mounting method according to the third embodiment, the nozzle unit may be moved from a withdraw position withdrawing from a position between the imaging unit and the substrate to the position between the imaging unit and the substrate in the relative positioning step, and the correcting step is executed when the nozzle unit is positioned directly above the mount target position on the substrate.

It is to be noted that any arbitrary combination of the above-described structural components as well as the expressions according to the present invention changed among a system and so forth are all effective as and encompassed by the present embodiments.

According to the embodiments, it is able to downsize the nozzle unit, by means of making the end member to be the transparent body which seals one opening opposite to the suction hole of the tuber body of the nozzle unit and taking images of the suctioned surface of the workpiece through the transparent body and the suction hole when the workpiece is suctioned by the suction hole. Therefore, it is able to detect the pattern for positioning of the workpiece which is difficult to recognize the pattern for positioning thereof by using prier arts.

BRIEF DESCRIPTION OF THE DRAWINGS

Embodiments will now be described, by way of example only, with reference to the accompanying drawings which are meant to be exemplary, not limiting, and wherein like elements are numbered alike in several figures, the drawings in which:

FIGS. 4A-4C are explanatory views of a mounting operation of the apparatus shown FIG. 1 etc.;

DETAILED DESCRIPTION OF THE INVENTION

The invention will now be described based on the following embodiments which do not intend to limit the scope of the present invention but exemplify the invention. All of the features and the combinations thereof described in the embodiments are not necessarily essential to the invention.

An embodiment mentioned bellow executes positioning of an electronic device such as a bare chip IC etc. (hereinafter "workpiece") by way of taking an image of a pattern for positioning on an upper surface of the workpiece through a suction hole which suctions the workpiece.

Figure 1:
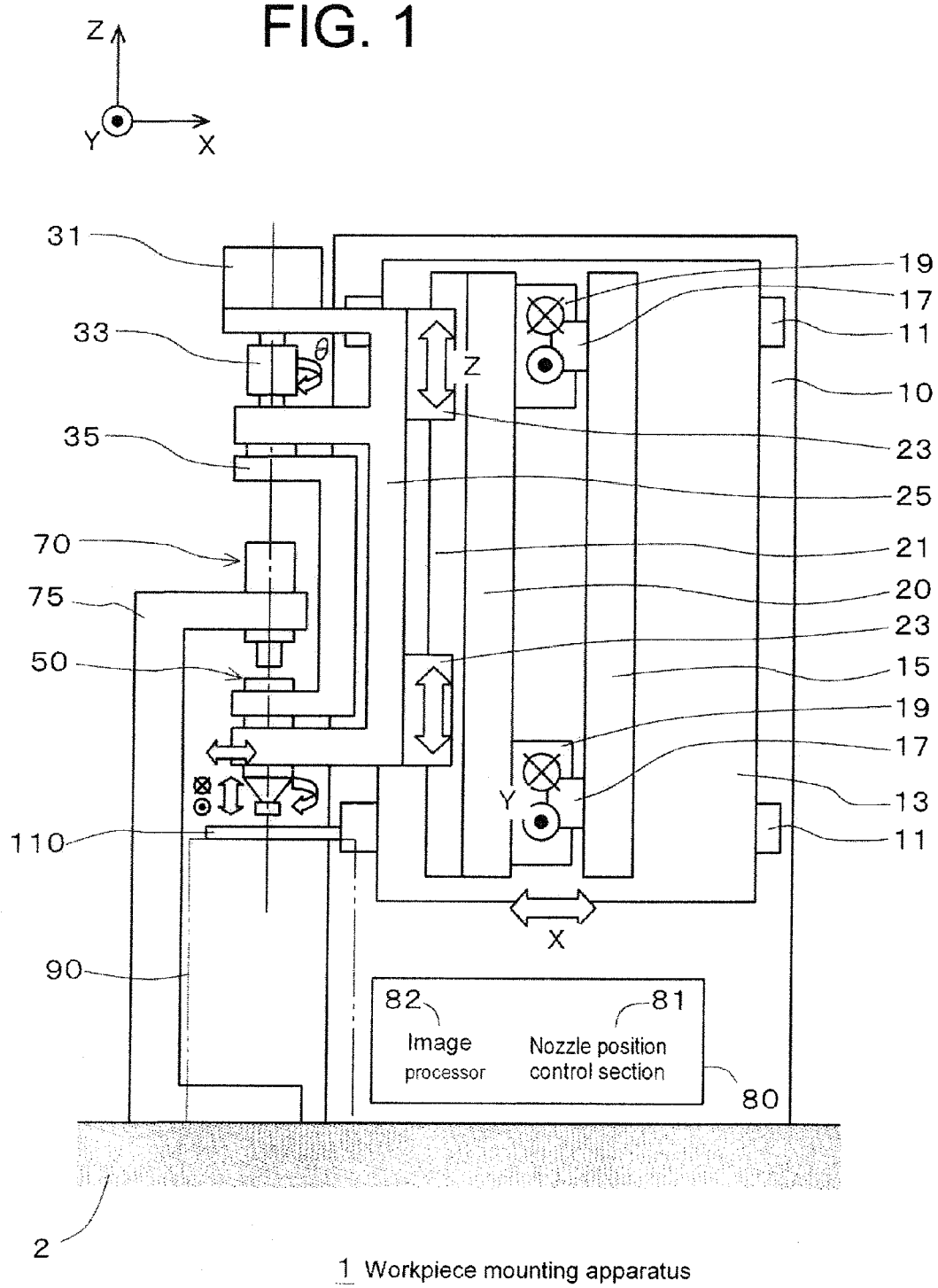
FIG. 1 is a rough side view of a workpiece mounting apparatus (including a workpiece transfer apparatus) according to an embodiment of the present invention.
Figure 2:
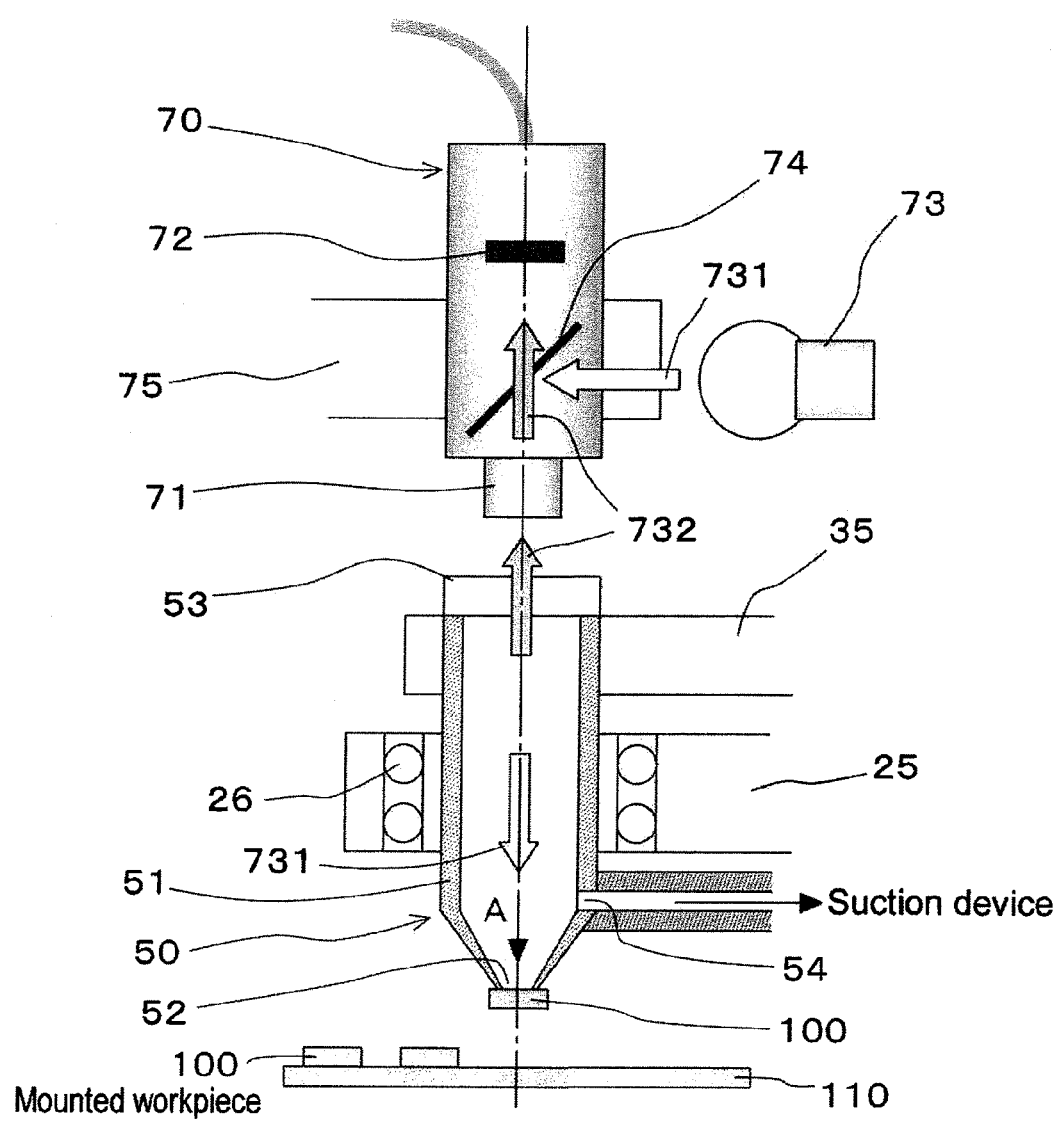
FIG. 2 is an enlarged main part cross-sectional view of FIG. 1.
Figure 3A:
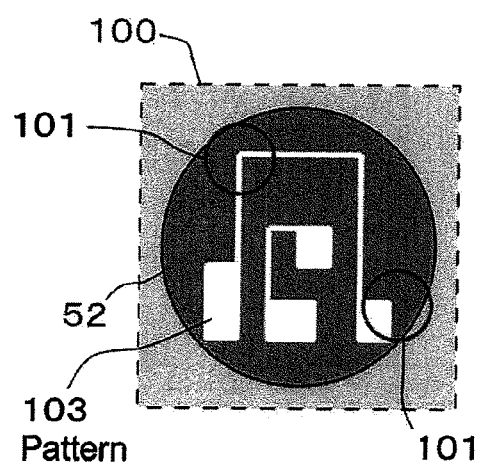
FIG. 3A is a plan view indicated by arrow A in case of a circular suction hole.
Figure 3B:
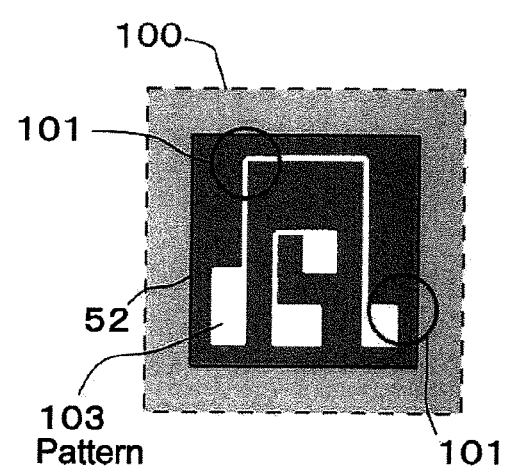
FIG. 3B is a plan view indicated by arrow A in case of a rectangular suction hole.
Figure 5:
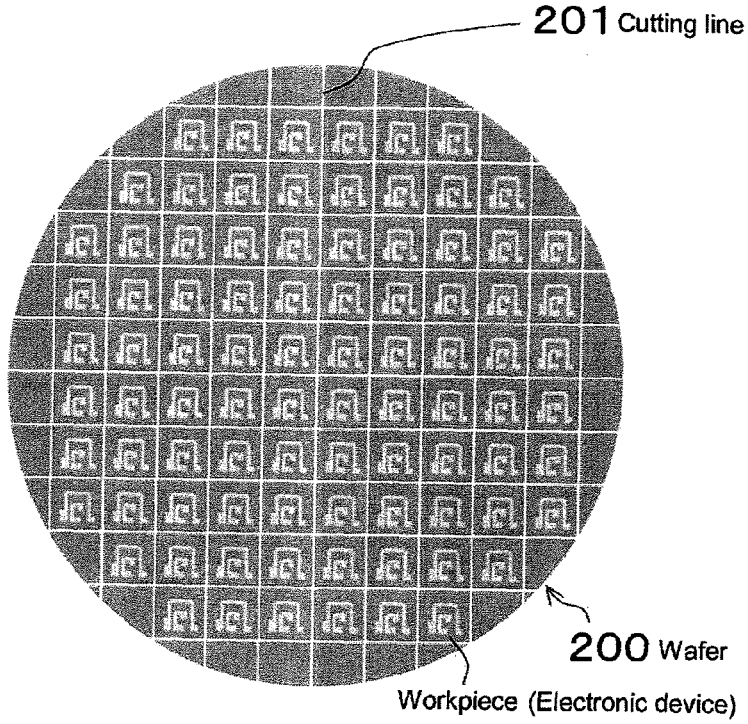
FIG. 5 is an illustrative plan view of a wafer including many workpieces.
Figure 6:
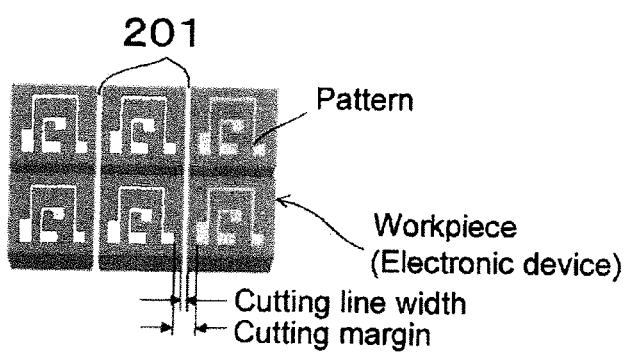
FIG. 6 is an enlarged plan view of many workpieces.

FIG. 1 is a rough side view of a workpiece mounting apparatus 1 according to the embodiment of the present invention. In FIG. 1, each direction of XYZ-axes that are orthogonal three axes are defined. FIG. 2 is an enlarged main part cross-sectional view of FIG. 1. FIG. 3A is a plan view of an example indicated by arrow A in case of a suction hole 52 of a nozzle unit 50 is circular. FIG. 3B is a plan view of another example indicated by arrow A in case of the suction hole 52 of the nozzle unit 50 is rectangular.

Figure 7:
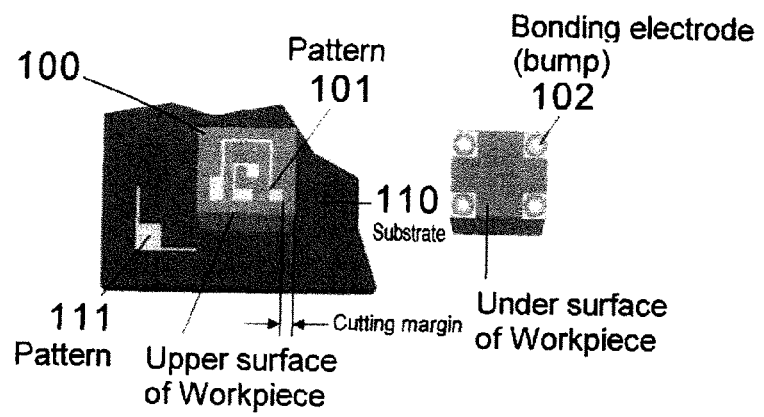
FIG. 7 is an explanatory view of a workpiece mounted on a substrate.
Figure 8A:
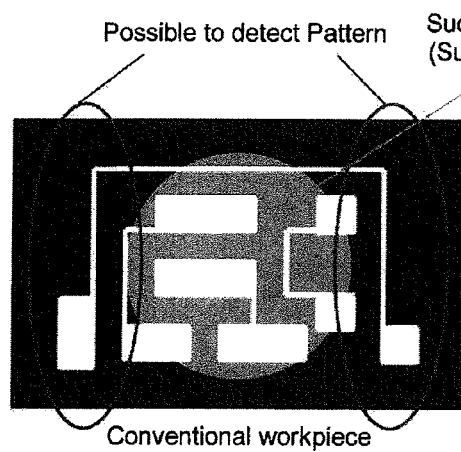
FIGS. 8A, 8B are explanatory views of a related art.
Figure 8B:
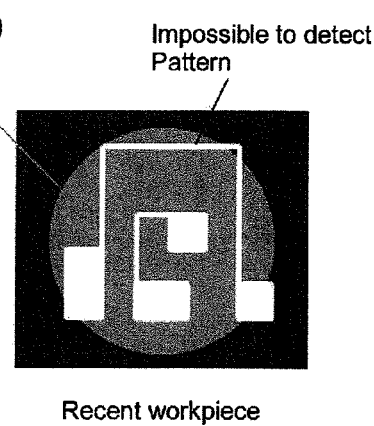
Figure 9A:
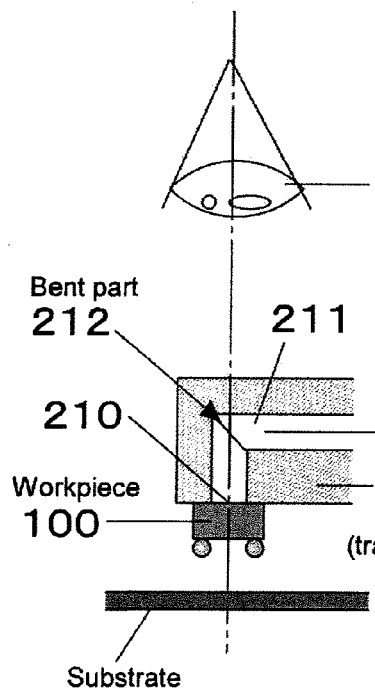
FIG. 9A is a cross-sectional view of an apparatus of a related art in case of mounting a workpiece.
Figure 9B:
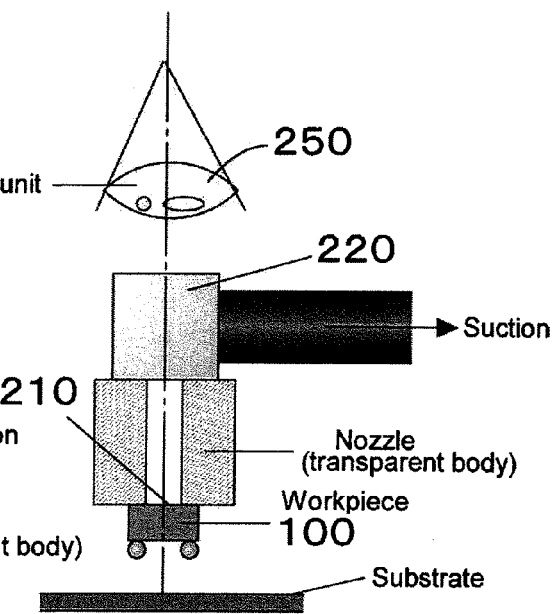
FIG. 9B is a cross-sectional view of another apparatus of a related art in case of mounting a workpiece.

For example, the workpiece 100 as a mounting object is shown in FIG. 7, and a first pattern(s) for positioning 101 for position adjustment is(are) provided on a suctioned surface (a surface of Z+ direction) also shown in FIG. 3. There is a relation that a position of the workpiece 100 is identified if a position of the first pattern for positioning 101 is recognized. In the case of FIGS. 3 and 7, parts of a pattern 103 of the workpiece 100 are used as the first patterns for positioning 101. The workpiece 100 has electrodes 102 located on an undersurface thereof as shown in FIG. 7. But, electrodes 102 shown in FIG. 7 are an arbitrarily matter, and not limited shown configuration. A second pattern for positioning 111 is provided with a substrate 110 on which the workpiece 100 is mounted as shown in FIG. 7, or a plurality of marks 111 may be provided with the substrate 100. There is a relation that a position of the substrate 110 is identified if a position of the second pattern for positioning 111 is recognized. In ordinary case, a plurality of the second patterns for positioning 111 is provided with the substrate 110 for correcting in θ-axis direction.

The workpiece mounting apparatus 1 includes a nozzle unit 50, an imaging unit 70, a controller 80 and a substrate support unit 90. In workpiece mounting apparatus 1, a workpiece transfer apparatus consist of above mentioned members except the substrate support unit 90 which can support and hold the substrate. The workpiece mounting apparatus 1 is a configuration that executes positioning of the workpiece and mounting the workpiece on the substrate by using the transfer apparatus. The substrate support unit 90 includes a substrate loader and unloader and so on, and the substrate support unit 90 has functions of positioning and holding of the substrate 110. A configuration of the substrate support unit 90 is well known, of which explanations are omitted. A workpiece mount surface (upper surface) is parallel to the XY-planes.

As shown in FIG. 2, the nozzle unit 50 includes a cylindrical body 51 as a tuber nozzle body, a suction hole 52, a transparent body 53 and a suction pathway (vacuum vent) 54. The cylindrical body 51 has a tapered shape of a bottom part thereof and of which center axis is parallel to Z-axis. The cylindrical body 51 can be made of an arbitrarily selected material, but not limited. The cylindrical body 51 may be a metal for example aluminum etc. which can be microfabricated. The suction hole 52 is opened at one end of the cylindrical body 51 (bottom end that is an end of the taper shape). The suction hole 52 makes the imaging unit 70 capable of taking an image of the first pattern for positioning 101 on an upper surface (suctioned surface) of the workpiece 100, and the size and shape of the suction hole 52 fits within an outline of the upper surface of the workpiece 100. A cross-section shape of the suction hole 52 may be a circular shape, and may be a polygonal shape for example a rectangular and so on if a hole processing is possible (referring to FIG. 3). The center axis of the cylindrical body 51 passes through the suction hole 52. The transparent body 53 as an end face member sealing the other end (upper end) of the cylindrical body 51 is a flat plate made of a glass or quart etc. for example. The transparent body 53 achieves both maintaining negative-pressure of inside of the cylindrical body 51 and optical penetration toward to the imaging unit 70. The suction pathway 54 opens at an inner side surface of the cylindrical body 51, and the suction pathway 54 is connected to a suction device (negative-pressure source not shown). The suction hole 52 can pick up the workpiece 100 by means of the maintaining negative-pressure of inside of the cylindrical body 51 depending on the suction device.

The nozzle unit 50 is supported to be movable in XYZ-axes direction and rotatable about θ-axis (that accords to the center axis of the cylindrical body 51). Functions of each derive axis are as follows:

X drive axis: for workpiece transfer, and for adjustment so as to match between the fiducial of the substrate and the fiducial of the workpiece in X-axis direction.

Y drive axis: for workpiece transfer, and for adjustment so as to match between the fiducial of the substrate and the fiducial of the workpiece in Y-axis direction.

Z drive axis: for pickup and mounting of the workpiece.

θ drive axis: for adjustment so as to match between the fiducial of the substrate and the fiducial of the workpiece in θ-axis direction. Further, each drive axis is connected to a drive transmission mechanism, some of the drive transmission mechanisms are not shown in FIG. 1. The X and Y drive axes may be connected to a drive transmission mechanism of coarse motion for transfer and a drive transmission mechanism of micromotion for adjustment (not shown) respectively. Above mentioned support mechanisms are common knowledge, however, they will described briefly bellow.

A relative positioning unit for nozzle unit 50 (nozzle unit support mechanism) includes a first support member 10, X-axis rails 11, a X slider 13, a second support member 15, Y-axis rails 17, Y-axis slide guides 19, a Y slider 20, Z-axis rails 21, Z-axis slide guides 23, a Z slider 25, a θ-axis drive motor 31, a θ rotating shaft 33 and a θ-axis drive transmission member 35.

The X-axis rails 11 extending in X-axis direction are fixed on a wall surface (parallel to the XZ-plane) of the first support member 10 which is fixed on a base 2. The X slider 13 is slid along the X-axis rails 11 by the X drive shaft and the X drive axis driving motor (not shown). The second support member 15 is fixed on the X slider 13. The Y-axis rails 17 are fixed on a wall surface (parallel to the YZ-plane) of the second support member 15. The Y slider 20 is fixed to the Y-axis slide guides 19 which are slidable on the Y-axis rails 17, so that the Y slider 20 is slid along the Y-axis rails 17 by the Y drive shaft and the Y drive axis driving motor (not shown). The Z-axis rails 21 are fixed on the Y slider 20. The Z slider 25 is fixed to the Z-axis slide guides 23 which are slidable on the Z-axis rails 21, so that the Z slider 25 is slid along the Z-axis rails 21 by the Z drive shaft and the Z drive axis driving motor (not shown). The θ-axis driving motor 31 is supported by the Z slider 25. The θ rotating shaft 33 driven by the θ-axis driving motor 31 and the cylindrical body 51 of the nozzle unit 50 is rotatably supported by the Z slider 25 with bearings 26 and so on. One end of the θ-axis drive transmission member 35 is fixed to the θ rotating shaft 33 and the other end holds a side surface of the cylindrical body 51 of the nozzle unit 50. Center axes of the θ rotating shaft 33 and cylindrical body 51 are coaxially-arranged. In above mentioned relative positioning unit (nozzle unit support mechanism), the nozzle unit 50 is movable in XYZ-axes direction and rotatable about θ-axis by means of controlling the driving motors. A nozzle position control section 81 of a controller 80 controls each driving motor. For example, the controller 80 is built into the first support member 10, and the controller 80 is made as a cooperative system of hardware and software.

The imaging unit 70 is a two-dimensional camera for example, and that is supported and fixed by an imaging unit support member 75 which is fixed and stood on the base 2. The imaging unit 70 includes a lens 71, an imaging element 72, a light 73 and a splitter 74 (half mirror). As shown in FIG. 2, the light 73 radiates light beam 731 which is reflected by the splitter 74 and reaches to the suctioned surface of the workpiece 100. The lens 71 may be selected from a proper one of public knowledge that has an intended focal length and magnification ratio. A light axis of the lens 71 is parallel to the Z-axis, so that the light axis coincides with the center axis of the cylindrical body 51 of the nozzle unit 50 and passes through the center of the suction hole 52. For instance, the imaging unit 70 can take an image of the workpiece 100 suctioned and held by the suction hole 52 optically through the transparent body 53 and the suction hole 52. The imaging element 72 is arbitrarily selected from a CCD, CMOS or the like. The light 73 and the splitter 74 make up a coaxial lighting. For instance, a light beam 731 from the light 73 is bent in a parallel direction to the optical axis by the splitter 72, so that the light beam 731 is radiated to the suction hole 52. A reflected light beam 732 reflected by the suctioned surface of the workpiece passes the splitter 74 and reaches to the imaging element 72. Further, the coaxial lighting is preferable for the lighting of the imaging unit 70, but not limited to the coaxial lighting.

An image processor 82 in the controller 80 is electrically connected to the imaging unit 70 (a connection is not shown), and the image processor 82 carries out image processing of the output image of the imaging unit 70. In particular, the image processor 82 identifies (calculates) the position of the second pattern for positioning 111 of the substrate 110 based on the taken image of the substrate 110, so that the image processor 82 defines (calculates) a mount target position of the workpiece 100 (in other words, a target position of the pattern for positioning 101 on the workpiece 100) on the substrate 110 based on the position of the second pattern for positioning 111. The information of the mounting position (target position) contains a XY coordinate and an angle around the θ-axis. Further, the image processor 82 identifies (calculates) the position of the first pattern for positioning 101 of the workpiece 100 (reference position of the workpiece 100) based on the taken image of the workpiece 100, and derives (calculates) a position gap (that is a correction amount) between the position of the first pattern for positioning 101 and the mount target position. The correction amount includes a displacement in the XY directions and a rotation angle around the θ-axis.

Hereinafter, the operation of the embodiment, that is the workpiece mounting method, will be described.

FIGS. 4A-4C are explanatory views of a mounting operation of the apparatus shown FIG. 1 etc. In default condition, the substrate support unit 90 is positioning and holding the substrate 110 under the imaging unit 70 (on the light axis of the imaging unit 70) as shown in FIG. 4A, and the nozzle unit 50 is a withdrawing position from a range of view of the imaging unit 70.

A first taking image step: the imaging unit 70 takes image(s) of the second pattern for positioning 111 on the substrate 110 at least two places.

A mount target position identifying step: the image processor 82 identifies (calculates) the position of the second pattern for positioning 111 based on the taken image (the first image data) of the first taking image step, so that the image processor 82 defines (calculates) the target position of the first pattern for positioning 101 on the workpiece 100 (in other words, the mount target position of the workpiece 100 on the substrate 110) based on the identified position of the second pattern for positioning 111.

A relative positioning step for the nozzle unit 50: the nozzle unit 50 picks up the workpiece, and the nozzle position control section 81 controls each driving motor of the nozzle unit support mechanism so as to move the nozzle unit 50 to the position where the imaging unit 70 capable of taking the image of the workpiece 100 as shown in FIG. 4B. In other words, the position is between the substrate 110 and imaging unit 70, and is preferably the position directly above the mount target position on the substrate 110. After the relative positioning, the light axis of the imaging unit 70 approximately coincides with the center axis of the cylindrical body 51 of the nozzle unit 50.

A second taking image step: the imaging unit 70 takes image of the first pattern for positioning 110 on the workpiece 100 at least two places. Where, the imaging unit 70 takes image of a suctioned surface of the workpiece 100 through the transparent body 53 and the suction hole 52. Further, a difference of focal lengths between the first taking image step and the second taking image step can be adjusted by known means of automatic focus or the like.

A current workpiece position identifying step: the image processor 82 identifies (calculates) the current positions of the first pattern for positioning 101 (the reference position of the workpiece 100) based on the taking image (the second image data) of the first pattern for positioning of the second taking image step, and derives (calculates) a deference between the target position of the first pattern for positioning 101 and the current position of the same, that is a necessary correction amount to coincide the position of the first pattern for positioning 101 to the target position.

A workpiece position correcting step: the nozzle position control section 81 controls each driving motor of the nozzle unit support mechanism, and corrects the relative position between the nozzle unit 50 and the substrate 110 (in XYθ-directions) so that the position of the first pattern for positioning 101 (that is the reference position of the workpiece) coincides with the target position (that is the mount target position of the workpiece 100).

A workpiece mounting step: the nozzle position control section 81 makes nozzle unit 50 move downwardly in Z direction as shown in FIG. 4C, and the nozzle unit 50 mounts the workpiece 100 on the substrate 110 while maintaining of matching the position of the first pattern for positioning 101 to the target position. A mounting method of the workpiece 100 can be selected form known methods using an ultrasonic wave, silver paste, thermocompression bonding or the like. The workpiece mounting step is achieved with the nozzle unit 50 only moving downwardly in Z direction, in other wards without moving in XY direction and rotation around the θ-axis, mounting positional accuracy of the workpiece 100 is improved because of exclusion of moving accuracy in XYθ-axes. If the correction of θ-axis is not necessary, it may be at one place of the first pattern for positioning 101 to be taken in the second taking image step, and also may be at one place of the second pattern for positioning 111 to be taken in the first taking image step.

As a result of the embodiment of the present invention, it is able to downsize the nozzle unit 50, by means of making the end member to be transparent body 53 which seals one opening opposite to the suction hole 52 of the cylindrical body 51 of the nozzle unit 50 and taking images of the suctioned surface of the workpiece 100 through the transparent body 53 and the suction hole 52 when the workpiece 100 is suctioned by the suction hole 52. Therefore, it is able to detect the pattern for positioning of the workpiece which is difficult to recognize the pattern for positioning thereof by using prior arts.

It is preferable to make the configuration simple because images of the first pattern for positioning 101 and second pattern for positioning 111 are taken by the same imaging unit 70.

Described above are explanations based on the embodiment. The description of the embodiment is illustrative in nature and various variations in constituting elements and processes involved are possible. Those skilled in the art would readily appreciate that such variations are also within the scope of the present invention. Examples of the variations are explained hereafter.

The second pattern for positioning 111 may be positioned at the under surface (a surface of Z− direction side) of the substrate 110. In this case, the second imaging unit and light (not shown) are additionally provided separately with the imaging unit 70 (the first imaging unit) taking images of the first pattern for positioning 101 of the workpiece 100. The second imaging unit must be used after position calibration between the imaging unit 70 and the second imaging unit by a known method. It is preferable to correct the position of the workpiece 100 when the workpiece 100 is positioned directly above the mount position on the substrate 110, so that mounting positional accuracy of the workpiece 100 is improved because of exclusion of moving accuracy in XYθ-axes after the position correction. Further, an imaging unit for taking images of the second pattern for positioning 111 may provided separately with the imaging unit 70 for taking images of the first pattern for positioning 101 of the workpiece 100 even if the second pattern for positioning 111 is positioned the upper surface of the substrate 110 as same as the above mention embodiment.

A coordinate position of the second pattern for positioning 111 of the substrate 110 may be defined by a coordinate of whole surface of the substrate 110 or by a coordinate of each workpiece mounting part.

The nozzle unit 50 may move relatively for the imaging unit 70 and the substrate 110, thus, the imaging unit 70 and the substrate 110 may move for the nozzle unit 50.

The imaging unit 70 may be a fixed focus one, in the case the imaging unit 70 may be moved in Z direction for focusing by an imaging unit drive means between the first and second taking image step.

The upper side member of the nozzle unit 50 (transparent body 53 in the embodiment) is not needed to be transparent in all surface, if the imaging unit 70 can take images of the workpiece 100 optically through the upper side member and suction hole 52. All of the nozzle unit 50 may be an integral transparent body as the same material.

What is claimed is:

1. A workpiece mounting apparatus comprising:
   a workpiece transfer apparatus including
      a nozzle unit including a tubular body having opposed first and second ends, a suction hole opening at the first end of the tubular body, and an end face member sealing the second end of the tubular body, wherein at least part of the end face member is transparent,
      an imaging unit for capturing, through the end face member and the suction hole, an image of a first pattern for positioning of a workpiece, the first pattern being located on a surface of the workpiece that is held at the suction hole, and
      an image processor for identifying a reference position of the workpiece based on an image including the first pattern for positioning that is captured by the first imaging unit;
   a substrate support unit supporting a substrate which has a second pattern for positioning located on at least one side of the substrate, wherein the imaging unit captures an image including the second pattern for positioning of the substrate supported by the substrate support unit; and
   a relative positioning unit for controlling relative position of the nozzle unit; wherein
      the image processor identifies a mounting target position on the substrate, based on the image including the second pattern for positioning that is captured by the imaging unit, and
      the relative positioning unit controls the nozzle unit to mount the workpiece on the substrate, when the reference position of the workpiece, identified by the first pattern for positioning, coincides with the mounting target position on the substrate.

\* \* \* \* \*